United States Patent [19]
Tomatsu et al.

[11] Patent Number: 5,285,168
[45] Date of Patent: Feb. 8, 1994

[54] OPERATIONAL AMPLIFIER FOR STABLY DRIVING A LOW IMPEDANCE LOAD OF LOW POWER CONSUMPTION

[75] Inventors: Takashi Tomatsu, Fuchu; Takaaki Noda, Higashimurayama, both of Japan

[73] Assignees: Hitachi, Ltd., Tokyo; Akita Electronics Co., Ltd., Akita, both of Japan

[21] Appl. No.: 944,921

[22] Filed: Sep. 15, 1992

[30] Foreign Application Priority Data

Sep. 18, 1991 [JP] Japan .................. 3-267247
Aug. 10, 1992 [JP] Japan .................. 4-212753

[51] Int. Cl.[5] ............................................. H03F 3/45
[52] U.S. Cl. ...................................... 330/253; 330/255
[58] Field of Search ............... 330/253, 255, 257, 261, 330/264, 269, 277

[56] References Cited

U.S. PATENT DOCUMENTS 4,459,555 7/1984 Jett ........................................ 330/253
5,034,700 7/1991 Herrmann et al. .............. 330/285 X

FOREIGN PATENT DOCUMENTS 60-7211  1/1985 Japan .
60-66510 4/1985 Japan .
60-79809 5/1985 Japan .
61-148906 7/1986 Japan .
62-68308 3/1987 Japan .
63-253706 10/1988 Japan .

*Primary Examiner*—Steven Mottola
*Attorney, Agent, or Firm*—Fay, Sharpe, Beall, Fagan, Minnich & McKee

[57] ABSTRACT

An operational amplifier is equipped at its input stage with a folded cascode type differential amplifier and at its downstream stage with pre-buffers, which include a differential amplification stage of PMOS input and a differential amplification stage of NMOS input, as level shifters. A MOS resistor having its gate terminal fed with an intermediate bias potential between a supply voltage $V_{DD}$ and an earth potential is connected between every one of the drain terminals of current-mirror connected load MOSFETs in the pre-buffers. As a result, the gains of the pre-buffers in the steady state can be suppressed to about 10 dB or less. The individual MOSFETs of the push-pull output stage are individually driven by the pre-buffers of low gains.

8 Claims, 10 Drawing Sheets

OPERATIONAL AMPLIFIER FOR STABLY DRIVING A LOW IMPEDANCE LOAD OF LOW POWER CONSUMPTION

BACKGROUND OF THE INVENTION

The present invention relates to a semiconductor integrated circuit technology and, more particularly, to a technology which is especially effective when applied to an AB grade operational amplifier including MOSFETs, such as a technology which is effective when utilized in a transmitting buffer amplifier for driving loads of low impedance such as the subscriber's lines of the ISDN communications net (i.e., Integrated Services Digital Network).

In recent years, the transmitting buffer amplifier for driving the low-impedance loads such as subscriber's lines has been packaged in a communications LSI such as the CODEC. Since this communications LSI is required to have a low power consumption, there is frequently used an AB grade amplifier which has a push-pull operation. In the AB grade amplifier, however, the steady current, which is to be suppressed as much as possible, is liable to be fluctuated by the process dispersion, and the stabilization of the steady current is an important target.

Thus, there has been proposed an invention (as disclosed in Japanese Patent Laid-Open No. 68308/1987). According to this disclosure, some of which is shown in FIG. 12, there is interposed between a folded cascode type differential input stage 1 and a complementary type push-pull output stage 3 a level shift stage 2 for level-shifting the output of a differential amplitude stage, so that the amplifier may perform the AB grade operation having a high driving ability while suppressing the steady current by increasing the voltage to be applied to the output stage 3.

In order to realize an AB grade amplifier having a low power consumption and a high driving ability, it is a key point that the variable range of the output of the differential input stage 1 is wide. In the above-specified invention, therefore, the potential of a well region to be formed with differential MOSFETs M13 and M14 is made negative, and MOSFETs M15 and M16 used in a cascode portion are those which have their threshold voltages raised to an extent corresponding to the band gap of silicon by doping the gate electrodes with an impurity of conduction type opposed to that of the drain regions. As a result, the variable range of the output of the differential input stage 1 is increased and is level-shifted to drive output MOSFETs MO1 and MO2 to provide an amplifier of high driving ability, which can drive the loads of low impedance with the small-sized MOSFETs.

SUMMARY OF THE INVENTION

In the amplifier, as shown in FIG. 12, a bias circuit 4 having a stack of four steps, in which four MOSFETs MB1 to MB4 are connected in series, is provided for eliminating the system offset, and the optimum constants are set so that the power consumption of the amplifier (i.e., the circuits 1, 2 and 3) may be proportional to that of the bias circuit 4. This power consumption of the bias circuit 4 is highly dependent upon the difference between the sum of the threshold voltages of the stacked four MOSFETs MB1 to MB4 and the supply voltage.

Here, the supply voltage of the amplifier of FIG. 12 is set at $+V$ and $-V$ (usually $\pm 5$ V) and designed to have a difference of 10 V. If the circuit thus constructed is packaged in an LSI having a single power source of $+5$ V, for example, there arises a problem that the power consumption is seriously influenced by the fluctuations of the process parameters such as the threshold voltage.

In recent years, the communications LSI has a tendency to use the single power supply of 5 V in accordance with the miniaturization of the process. Thus, there is a demand for a buffer amplifier which has few fluctuations in the power consumption and the characteristics even if the supply voltage drops.

An object of the present invention is to provide an AB grade amplifier which is stable in power consumption and characteristics and which can have a high driving ability even with a low power consumption.

The foregoing and other objects and novel features of the present invention will become apparent from the following description to be made with reference to the accompanying drawings.

The representatives of the invention to be disclosed herein will be summarized in the following.

Specifically, a folded cascode type differential amplifier is used at an input stage, and pre-buffers including a differential amplifier stage of PMOS input and a differential amplifier stage of NMOS input are provided as a level shifter at a downstream stage. At the same time, resistance elements are individually connected between the drain terminals of current-mirror connected load MOSFETs in those pre-buffers thereby to suppress the gains of the pre-buffers to about 10 dB or less. The output MOSFETs of the push-pull output stage are individually driven by the pre-buffers of low gains.

Moreover, the bias circuit to be used for driving a constant current source in the differential input stage or the pre-buffers is exemplified by a circuit having a low dependency upon the supply voltage and the process parameters.

Still moreover, MOSFETs are used as the resistance elements in the aforementioned pre-buffers and have their gate terminals fed with such a constant voltage intermediate between the supply voltage and the earth potential as can operate those MOSFETs from an unsaturated range to a saturated range.

Since the gain of the output stage drops for a low-impedance drive, the operational amplifier of the prior art is defective in a low DC gain and a poor linearity even for a voltage follower. According to the means thus far described, however, the input stage is exemplified by the folded cascode type differential amplifier, so that a DC gain as high as about 60 dB can be achieved at the input stage only, so that a high gain and an excellent linearity can be obtained in the entirety of the circuit, and so that even the gain of the output stage is low.

Moreover, resistors are disposed in the pre-buffers of PMOS and NMOS inputs, which are made receptive of the output of the differential input stage, to suppress the gains of the pre-buffers to 10 dB or less. Thus, the fluctuations of the bias point of the output stage due to the input offset dispersion of the pre-buffers can be suppressed within a practically allowable range to provide a circuit which has a high durability for the several parameter dependencies at the time of mass production.

In the bias circuit, moreover, there is practically used a circuit structure which can reduce the parameter dependencies excepting the temperature dependency.

By applying such circuit to the amplifier of the present invention, it is possible to realize a low-impedance drive amplifier which has a small characteristic dispersion and a low power consumption. The durability against the fluctuation factors can be enhanced to prevent malfunction.

Furthermore, MOSFETs are used as the resistance elements in the aforementioned pre-buffers so that they may function as variable resistors, in case their gate terminals are fed with a suitable voltage intermediate between the supply voltage and the earth potential, to suppress the gains of the pre-buffers to 10 dB or less in the steady state. If the MOSFETs at the output stage are to be driven, the pre-buffers can take high gains to improve the driving abilities of the low-impedance loads drastically.

DESCRIPTION OF THE PREFERRED EMBODIMENTS

Figure 1:
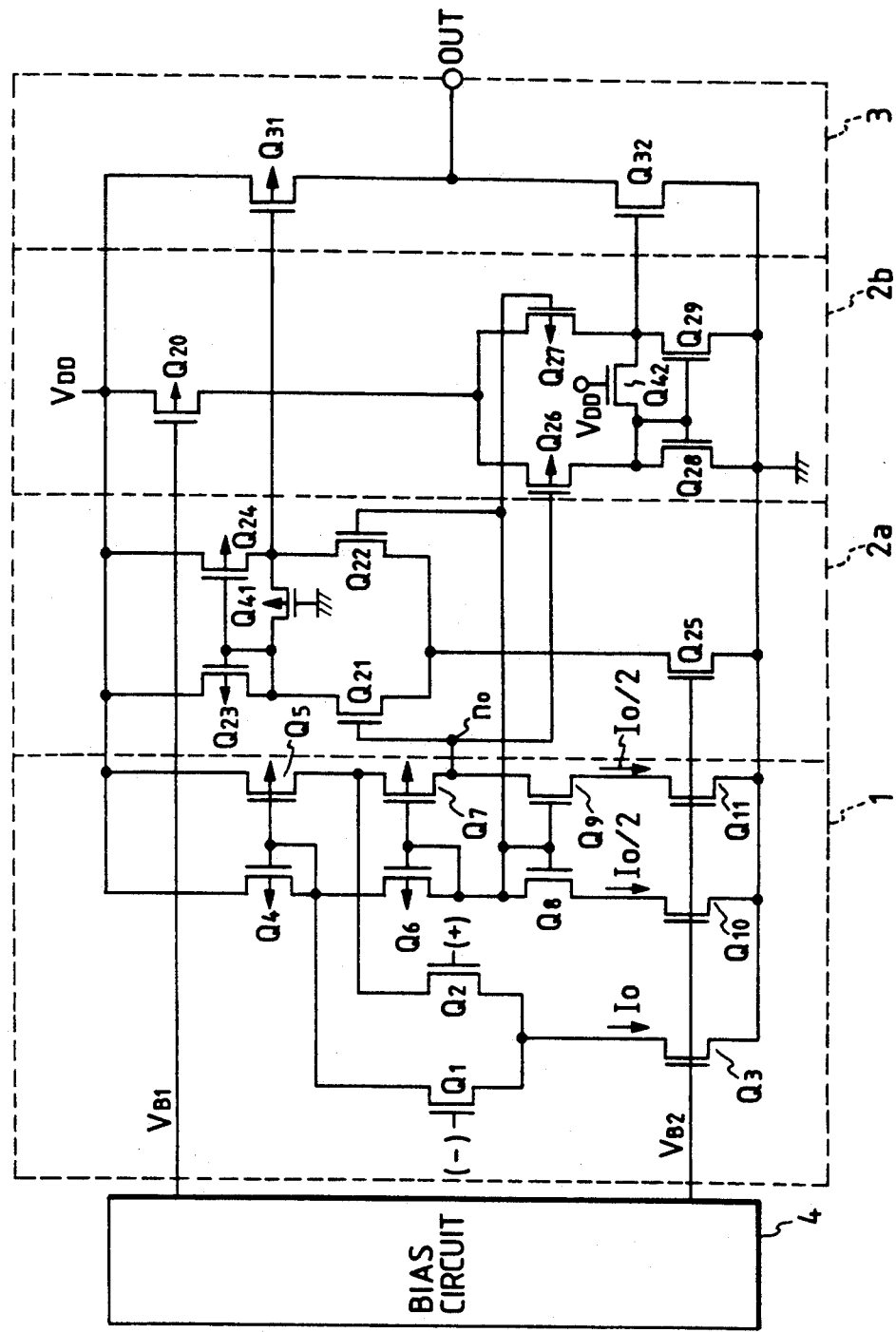
FIG. 1 is a circuit diagram showing one embodiment of a buffer amplifier according to the present invention.

FIG. 1 is a circuit diagram showing one embodiment of the present invention. The individual circuit elements of the same Figure are formed over a semiconductor substrate of single crystal silicon by the technology of manufacturing the well-known CMOS (i.e., Complementary MOS) integrated circuit. In the same Figure, MOSFETs having their channel portions arrowed belong to the P-channel type.

In this embodiment, an input stage 1 is constructed of a folded cascode type differential amplifier. Specifically, between the drain terminals of a pair of N-channel input differential MOSFETs Q1 and Q2 having their source terminals commonly connected and a supply voltage $V_{DD}$, there are connected P-channel load MOSFETs Q4 and Q5 which are current-mirror connected. Moreover, a P-channel MOSFET Q6 and N-channel MOSFETs Q8 and Q10 are connected in series between the drain terminal of the MOSFET Q4 and the grounded point, and a P-channel MOSFET Q7 and N-channel MOSFETs Q9 and Q11 are connected in series between the drain terminal of the MOSFET Q5 and the grounded point.

Of the aforementioned MOSFETs Q6 to Q11, the MOSFETs Q6 and Q7 and the MOSFETs Q8 and Q9 are respectively current-mirror connected. On the other hand, the MOSFETs Q10 and Q11 act as constant current sources if their gates are fed with a constant current $V_{B2}$ from a bias circuit 4. Moreover, the MOSFETs Q10 and Q11 have their individual constants set such that they are fed with one half of the current $I_O$ which is fed to a constant current MOSFET Q3 connected with the common source terminal of the input differential MOSFETs Q1 and Q2.

In the input stage 1 constructed of the folded cascode type differential amplifier, the MOSFETs Q6 and Q7 have their source terminals fed with the output of the input stage, i.e., the drain voltage of the MOSFETs Q1 and Q2 to generate their output voltages from their drain terminals thereby to perform a voltage amplification similar to that of a gate grounded type amplification element. By this amplification only, the differential input stage 1 is enabled to have a DC gain of about 60 dB. This embodiment is further equipped with an NMOS input pre-buffer 2a and a PMOS input pre-buffer 2b, which are turned operative in response to the drain voltage of the aforementioned MOSFETs Q6 and Q7.

The pre-buffer 2a is a differential amplifier which is constructed to include: a pair of N-channel differential MOSFETs Q21 and Q22; current-mirror load MOSFETs Q23 and Q24 connected between the drain terminals of the MOSFETs Q21 and Q22 and the supply voltage $V_{DD}$; and a constant current MOSFET Q25 connected with the common source terminal of the MOSFETs Q21 and Q22. On the other hand, the pre-buffer 2b is a differential amplifier which is constructed to include: a pair of P-channel differential MOSFETs Q26 and Q27; current-mirror load MOSFETs Q28 and Q29 connected between the drain terminals of the MOSFETs Q26 and Q27 and the grounded point; and a constant current MOSFET Q20 connected with the common source terminal of the MOSFETs Q26 and Q27.

In this embodiment, a P-channel MOSFET Q41 is connected between the drain terminals of the load MOSFETs Q23 and Q24 of the pre-buffer 2a, and an N-channel MOSFET Q42 is connected between the load MOSFETs Q28 and Q29 of the pre-buffer 2b. The aforementioned MOSFETs Q41 and Q42 are turned ON at all times to act as resistance elements because their gate terminals are fed with the earth potential and the supply voltage $V_{DD}$.

In this embodiment, moreover, the gains of the pre-buffers 2a and 2b are set to 10 dB or less by adjusting the ON resistances of the MOSFETs Q41 and Q42. And, these pre-buffers 2a and 2b have their single-end outputs respectively fed to the gate terminals of output MOSFETs Q31 and Q32 of a push-pull output stage 3. Thus, the pre-buffers 2a and 2b operate as level shifters having low gains to give proper bias points to the MOSFETs Q31 and Q32 of the output stage.

In case the aforementioned pre-buffers 2a and 2b are neither equipped with the MOSFETs Q41 and Q42 nor can suppress the gains with their ON resistances, their output sides experience a dispersion of about 500 mV, i.e., one hundred times as high as the input offset of 5 mV assumed at the two pre-buffers. As a result, the MOSFETs Q31 and Q32 have their bias points seriously fluctuated up to 1 V in the approaching directions. Then, a high current will flow through the MOSFETs Q31 and Q32 of the output stage. In the departing directions, on the contrary, little current will flow through the output stage 3 so that the desired characteristics cannot be achieved.

In the embodiment thus far described, however, the gains of the pre-buffers 2a and 2b are suppressed by the ON resistances of the MOSFETs so that the dispersion can be suppressed to 30 mV or so at the output sides of the pre-buffers even if the input offset is assumed to be 5 mV. As a result, the influences for the input offset to give the characteristic dispersion are reduced to a relatively low level. Thus, it is the feature of the amplifier of the present embodiment that the suppression of the characteristic dispersion and the driving ability are balanced by controlling the gains of the pre-buffers properly.

Figure 2:
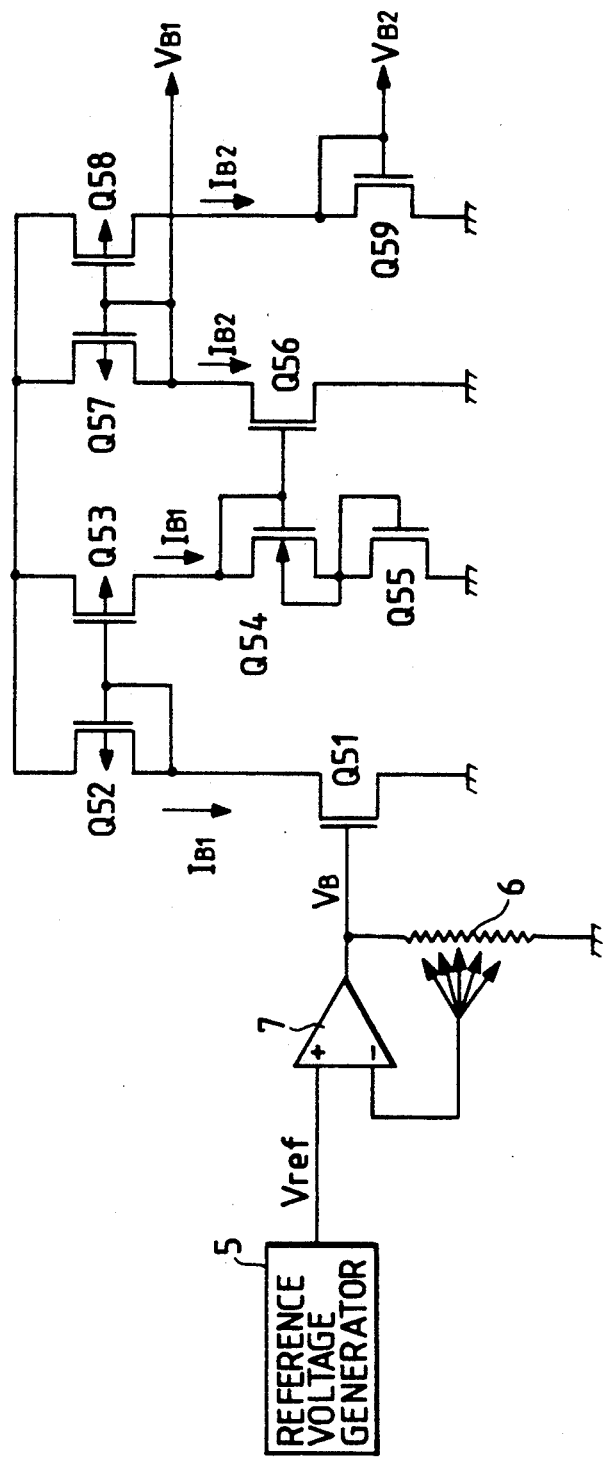
FIG. 2 is a circuit diagram showing an example of the structure of a bias circuit in the amplifier of FIG. 1.

FIG. 2 shows an example of the structure of a bias circuit which has such a small process dispersion as is suitable for the buffer amplifier of the aforementioned embodiment.

Specifically, this bias circuit is caused to generate a constant voltage $V_B$ such as 2.2 V by inputting a reference voltage such as 1.2 V, which is generated by a reference voltage generator 5, to a non-inverted amplifier 7 having such a variable resistor 6 as can be trimmed by a fuse or the like. Moreover, that constant voltage $V_B$ is inputted to the gate of an N-channel MOSFET Q51, which has its drain connected with a diode-connected MOSFET Q52 as a load. At the same time, there is provided a MOSFET Q53 which is current-mirror connected with the aforementioned MOSFET Q52. Diode-connected MOSFETs Q54 and Q55 are connected in series with the drain of the MOSFET Q53. Designs are so made that currents to flow through the MOSFETs Q52 and Q53 may be equalized to a value ($I_{B1}$).

Moreover, the drain voltage of the aforementioned MOSFET Q54 is fed to the gate of an N-channel MOSFET Q56 which has its drain connected with a diode-connected MOSFET Q57 as a load. At the same time, there is provided a MOSFET Q58 which is current-mirror connected with the aforementioned MOSFET Q57. A diode-connected MOSFET Q59 is connected in series with the drain of that MOSFET Q58. Designs are so made that currents to flow through the MOSFETs Q57 and Q58 may be equalized to a value ($I_{B2}$).

Moreover, the gate voltages of the aforementioned MOSFETs Q57 and Q59 are fed as the bias voltages $V_{B1}$ and $V_{B2}$ to the gate terminals of the constant current MOSFETs Q3, Q10 and Q11, and Q25 and Q20 of the input stage 1 and the pre-buffers 2a and 2b of the circuit of FIG. 1 thereby to feed such a bias current as is determined by the sizes of the MOSFETs.

In the bias circuit of FIG. 2, the W/L ratios (i.e., the ratios of the gate widths to the gate lengths) of the MOSFETs Q51, Q54, Q55 and Q56 are designated at $\beta_1$, $\beta_2$, $\beta_3$ and $\beta_4$, and the designs are made to satisfy $\beta_2 = \beta_3 = 4\beta_1$. Then, a current $I_B$ to flow through the MOSFET Q56 is determined by the following Equation:

$$I_B = 0.5 \times \beta_4 \times V_B^2.$$

Thus, it is possible to provide an extremely highly stable bias circuit in which the bias voltages $V_{B1}$ and $V_{B2}$ to be generated are dependent upon not the fluctuations of a threshold voltage Vth of the MOSFETs due to the process dispersion but the temperature coefficient only.

In the embodiment thus far described, the bias circuit is so designed that it generates the bias voltage $V_{B1}$ of 4.2 V and the bias voltage $V_{B2}$ of 0.7 V, although not especially limited thereto.

In the foregoing embodiment, the ON resistances of the MOSFETs Q41 and Q42 are connected between the drain terminals of the load MOSFETs Q23 and Q24, and Q28 and Q29 so as to drop the gains of the pre-buffers 2a and 2b. Despite this fact, however, the gains may be controlled by another circuit type. In case the gains of the pre-buffers 2a and 2b may be 1, for example, the MOSFETs Q41 and Q42 and the current mirror connections between the MOSFETs Q23 and Q24, and Q28 and Q29 may be eliminated, and the MOSFETs Q23 and Q24, and Q28 and Q29 may be exemplified merely by diode-connected load MOSFETs.

Moreover, the foregoing embodiment is exemplified such that the input stage 1 is constructed of the differential amplifier of NMOS input having the N-channel MOSFETs as the input transistors. Despite this fact, however, the present invention can naturally be applied to a buffer amplifier in which a differential amplifier of PMOS input having P-channel MOSFETs as its input transistors is used as its input stage.

As has been described hereinbefore, according to the foregoing embodiment, the input stage is exemplified by the folded cascode type differential amplifier whereas its downstream stage is equipped as the level shifters with the pre-buffers having the PMOS input differential amplifier stage and the NMOS input differential amplifier stage, and the resistors are individually connected between the drain terminals of the current-mirror connected load MOSFETs in those pre-buffers to suppress the gains of the pre-buffers to about 10 dB or less so that the individual output MOSFETs of the push-pull output stage may be driven by the pre-buffers of low gains. As a result, the fluctuations of the bias point of the output stage due to the input offset dispersion of the pre-buffers can be suppressed within a practically allowable range thereby to provide a circuit which has a high durability against the several parameter dependencies at the time of mass production. Thus, there can be attained an effect that it is possible to provide an AB grade amplifier which is stable in power consumption and characteristics and which has a high driving ability at a low power consumption.

Figure 3:
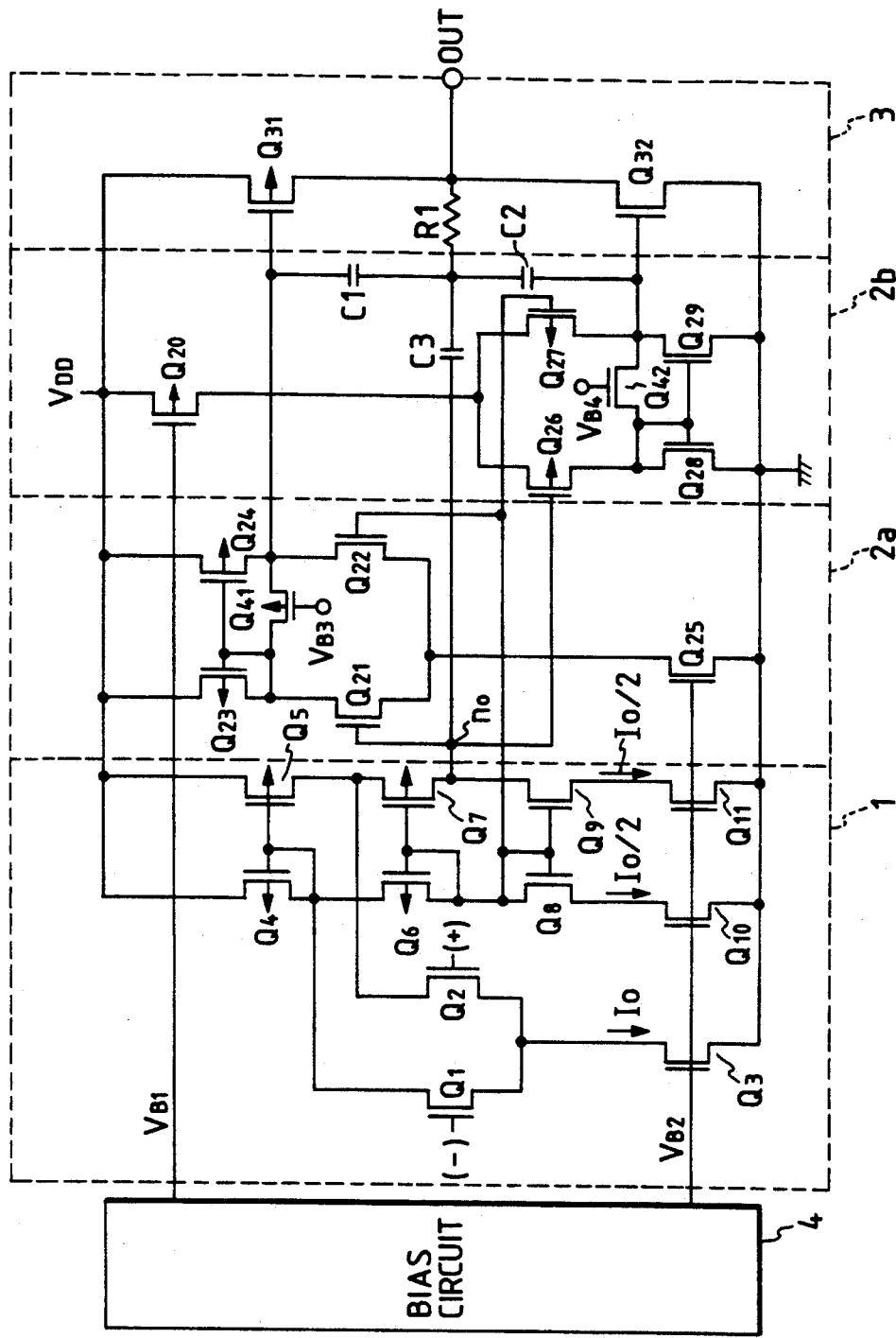
FIG. 3 is a circuit diagram showing another embodiment of a buffer amplifier according to the present invention.

FIG. 3 shows another embodiment of the present invention. The difference from the foregoing embodiment (i.e., the circuit of FIG. 1) resides in that intermediate potentials $V_{B3}$ and $V_{B4}$ generated by a bias circuit shown in FIG. 4 to have levels between the earth potential and the supply voltage $V_{DD}$ are respectively applied to the gate terminals of the P-channel MOSFET Q41 and the N-channel MOSFET Q42 acting as the resistance elements. In this embodiment, moreover, phase compensating capacitors C1, C2 and C3 and a resistor R1 are connected between an output terminal OUT and the gate terminals of the output MOSFETs Q31 and Q32 and between the output terminal OUT and an output node $n_O$ of the input stage 1.

The aforementioned bias potentials $V_{B3}$ and $V_{B4}$ are selected to have such potentials as operate the MOSFETs Q41 and Q42 from an unsaturated range to a saturated range. Specifically, the bias potential $V_{B3}$ is set to a potential higher than 0 V and lower than the bias voltage $V_{B1}$, and the bias potential $V_{B4}$ is set to a potential higher than the bias voltage $V_{B2}$ and lower than the supply voltage $V_{DD}$.

In the present embodiment, too, the gains of the pre-buffers 2a and 2b in the steady state (i.e., in the inoperative state wherein the input potential is equal to the analog reference potential) are set to about 10 dB by adjusting the ON resistances of the MOSFETs Q41 and Q42. The characteristics can be improved, as follows, by applying the bias potentials $V_{B3}$ and $V_{B4}$ from the bias circuit 4 to the gate terminals of those MOSFETs Q41 and Q42.

Specifically, as an amplifier input potential Vi exceeds the analog reference potential such as 1.9 V, the gain of the pre-buffer 2a for driving the MOSFET Q31 of the push-pull output stage 3 increases. As a result, the applied voltage of the gate terminal of the MOSFET Q31 rises so that the maximum drive current at the higher potential side increases with the driving ability of the load. If, on the contrary, the input potential Vi of the amplifier is lower than the analog reference voltage, the gain of the pre-buffer 2b for driving the MOSFET Q32 of the push-pull output stage 3 increases. As a result, the applied voltage of the gate terminal of the MOSFET Q32 rises so that the maximum drive current at the lower potential side increases with the driving ability of the load.

Next, the mechanism for realizing the gain characteristics of the aforementioned pre-buffers will be described in the following. When the input potential Vi of the amplifier changes, the MOSFETs Q41 and Q42 have their source-drain voltage Vds changed. If the MOSFETs Q41 and Q42 have their gate terminals fed with the earth potential and the supply voltage $V_{DD}$, respectively, as shown in FIG. 1, they always operate in the unsaturated range even with the voltage Vds changing with the input potential, so that their resistance values are substantially constant to make the gains of the pre-buffers 2a and 2b constant.

Figure 5:
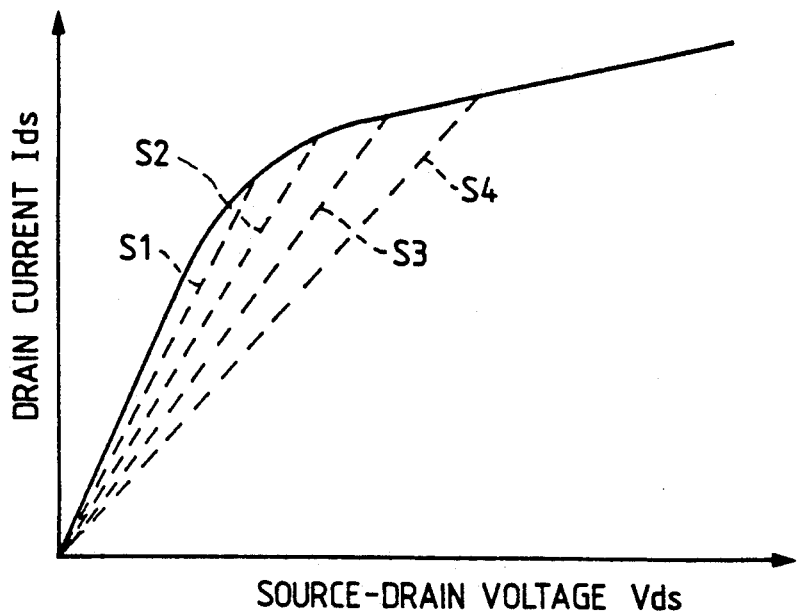
FIG. 5 is a graph exhibiting the Vds dependency of the ON resistances of the MOSFETs.

In the amplifier of the present embodiment, on the contrary, the MOSFETs Q41 and Q42 have their gate terminals fed with the bias potentials $V_{B3}$ and $V_{B4}$ of the bias circuit 4, respectively. When the input potential Vi of the amplifier exceeds the analog reference potential, the MOSFET Q41 has its operative range shifted from unsaturated to saturated, as shown in FIG. 5, as its source-drain voltage Vds increases. As a result, the MOSFET Q41 has its resistance value increased as the source-drain voltage Vds grows higher, so that the gain of the pre-buffer 2a increases.

Specifically, since a MOSFET has its ON resistance Ron expressed by Ron=Vds/Ids, the ON resistance Ron increases more as the gradients (=Ids/Vds=1/Ron) of straight lines S1, S2, S3 and S4 plotted in FIG. 5 become smaller, that is, as the drain current Ids becomes higher. Thus, the gain of the pre-buffer 2a increases.

When the input potential Vi of the amplifier becomes lower than the analog reference potential, the MOSFET Q42 in the pre-buffer 2b has its resistance increased more as the source-drain voltage Vds is the higher, because it operates from the unsaturated range to the saturated range as the source-drain voltage Vds increases. As a result, the gain of the pre-buffer 2b increases.

Figure 6:
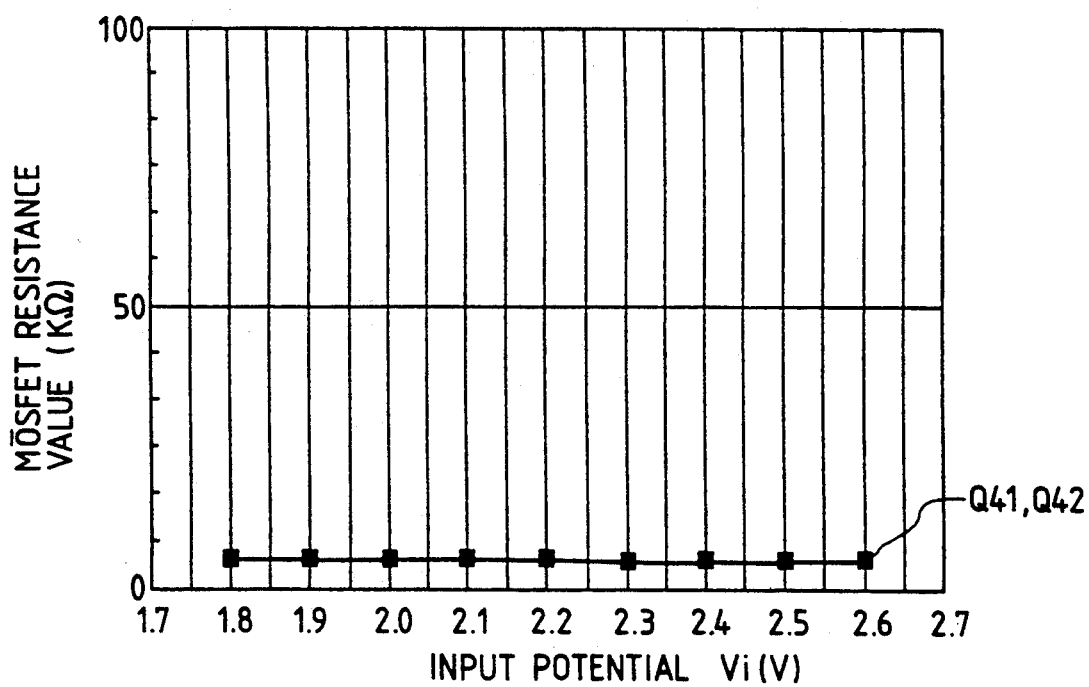
FIG. 6 is a graph exhibiting the input voltage dependency of the ON resistances of the MOSFETs in the amplifier of FIG. 1.
Figure 7:
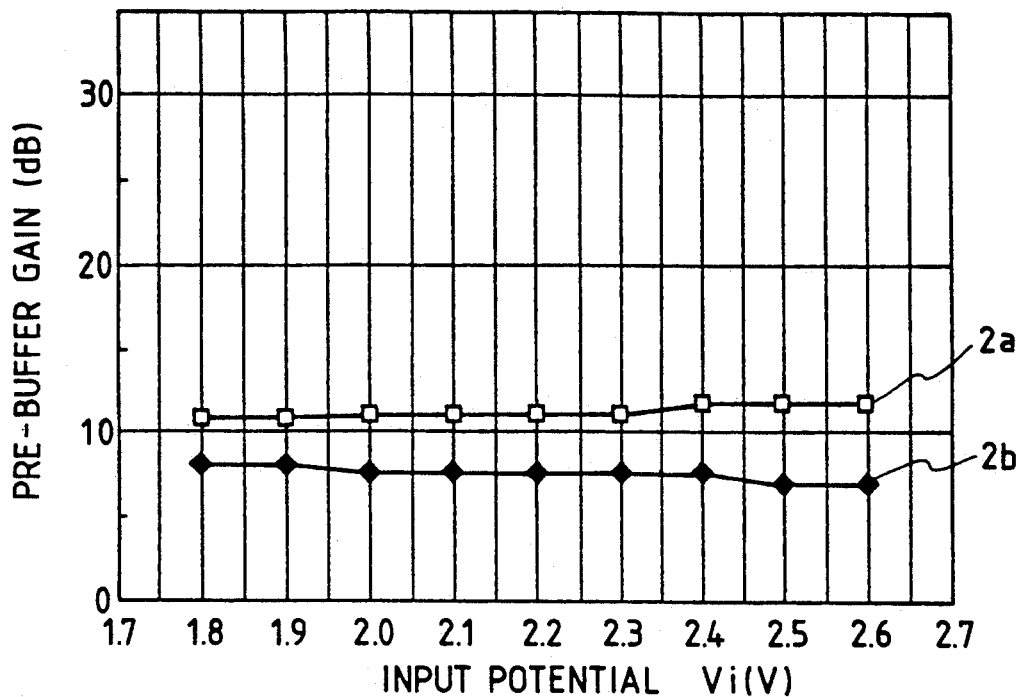
FIG. 7 is a graph exhibiting the input voltage dependency of the pre-buffer gains in the amplifier of FIG. 1.

FIGS. 6 and 7 plot the ON resistance characteristics (i.e., input voltage dependencies) of the MOSFETs Q41 and Q42 against the input potential Vi of the amplifier of FIG. 1 and the gain characteristics of the pre-buffers 2a and 2b against the input potential Vi. respectively.

In FIG. 6, symbol ■ plots the ON resistance of the MOSFETs Q41 and Q42. These MOSFETs Q41 and Q42 exhibit identical characteristics. In FIG. 7, on the other hand, symbol □ plots the gain of the pre-buffer 2a, and symbol ♦ plots the gain of the pre-buffer 2b.

Figure 8:
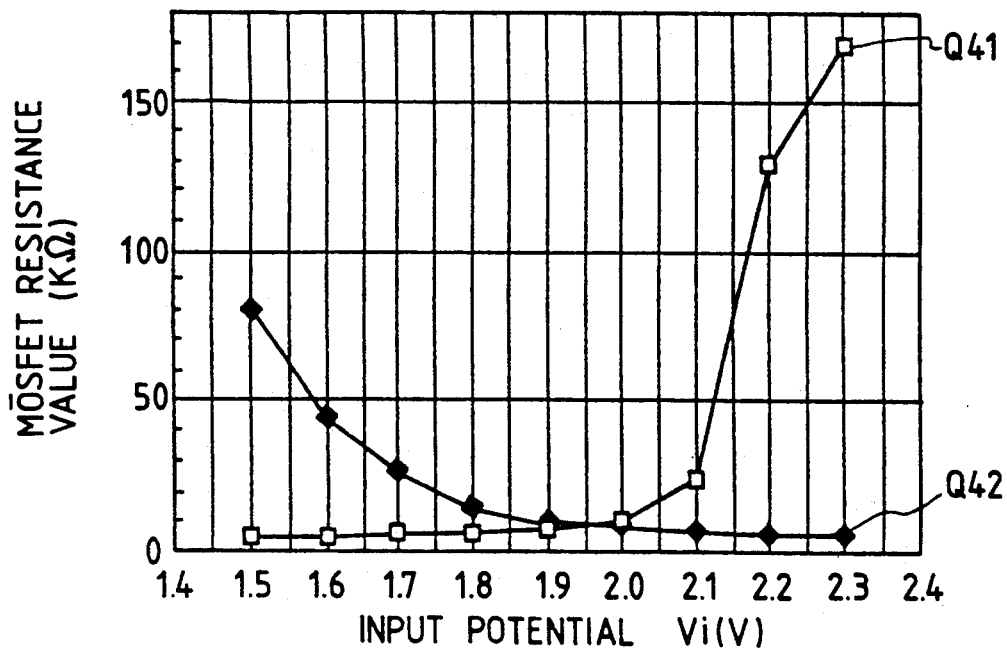
FIG. 8 is a graph exhibiting the input voltage dependency of the ON resistances of the MOSFETs in the amplifier of FIG. 3.
Figure 9:
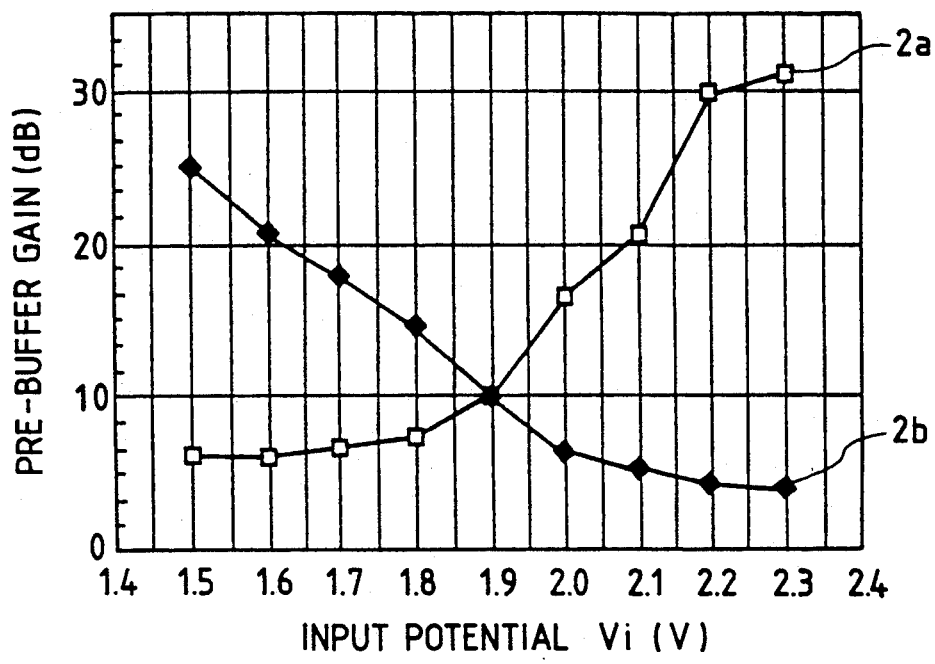
FIG. 9 is a graph exhibiting the input voltage dependency of the pre-buffer gains in the amplifier of FIG. 3.

On the other hand, FIGS. 8 and 9 plot the ON resistance characteristics of the MOSFETs against the input potential Vi of FIG. 3 and the gain characteristics of the pre-buffers 2a and 2b against the input potential Vi.

In FIG. 8, symbol □ plots the ON resistance of the MOSFET Q41, and symbol ♦ plots the ON resistance of the MOSFET Q42. In FIG. 9, on the other hand, symbol □ plots the gain of the pre-buffer 2a, and symbol ♦ plots the gain of the pre-buffer 2b.

From these Figures, it could be found that the gains of the pre-buffers 2a and 2b and the ON resistances of the MOSFETs Q41 and Q42 of the circuit of FIG. 1 are substantially constant against the input potential Vi, and that the ON resistances of the MOSFETs Q41 and Q42 of the circuit of FIG. 3 increase, when their loads are driven, so that the gains of the pre-buffers 2a and 2b also increase.

Since, however, the N-channel MOSFETs generally have higher driving abilities than those of the P-channel MOSFETs, the variable gain characteristics of the pre-buffers 2a and 2b may be made so asymmetric that the gain of the pre-buffer 2a for driving the MOSFET Q31 of the output stage may be higher than that of the pre-buffer 2b for driving the MOSFET Q32 of the output stage 3 at the load driving time. Specifically, there is a method for making the resistance of the MOSFET Q41 higher by adjusting the sizes of the MOSFETs Q41 and Q42.

Thus, in the buffer amplifier of the present embodiment, the fluctuations of the bias point of the output stage due to the input offset dispersions of the pre-buffers can be suppressed within an allowable range by suppressing the gain of the pre-buffers in the steady state to about 10 dB or less, and the driving ability of the low impedance load can be drastically improved by increasing the gains of the pre-buffers when the input potential Vi changes.

Figure 4:
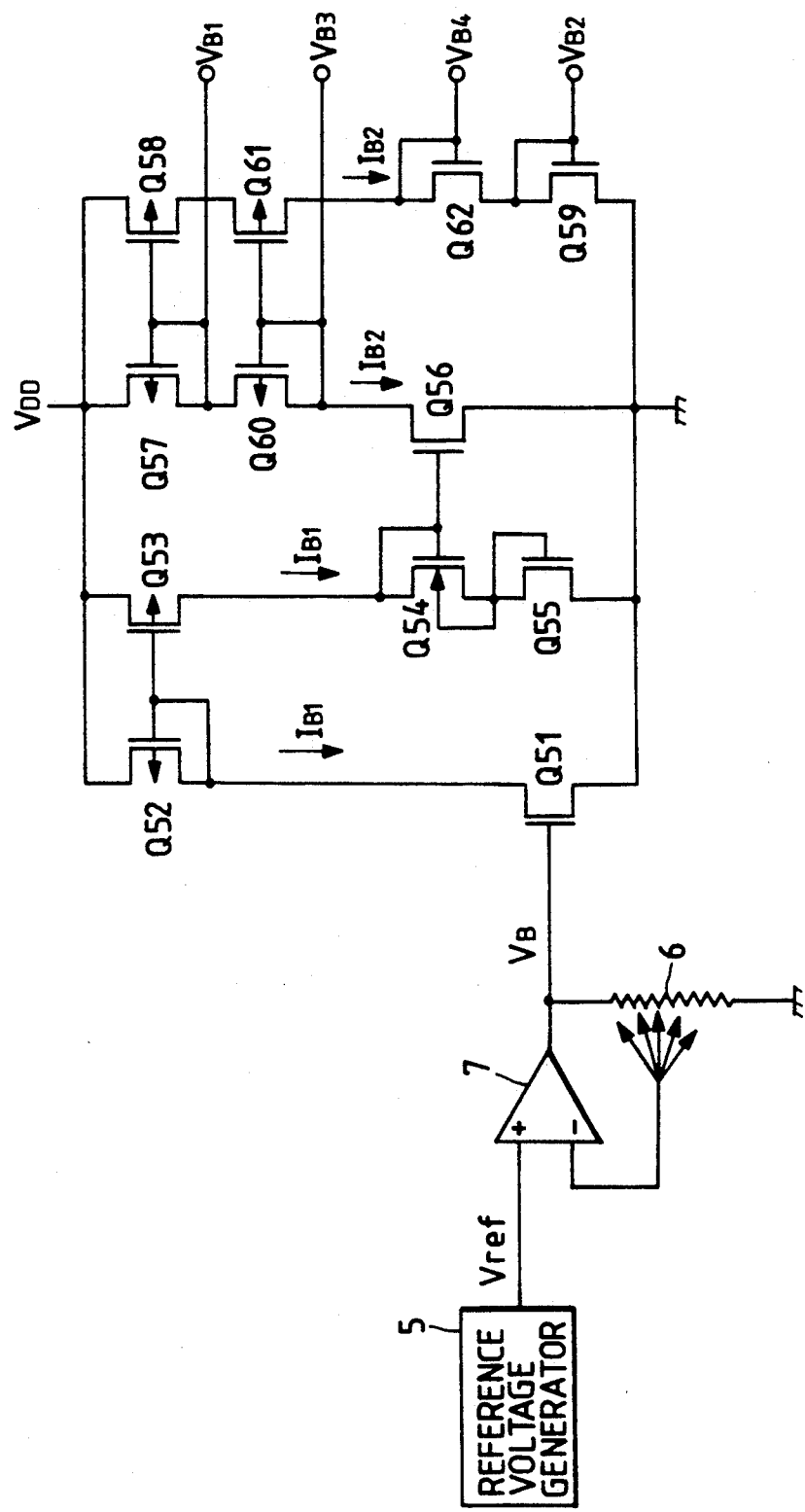
FIG. 4 is a circuit diagram showing an example of the structure of a bias circuit in the amplifier of FIG. 1.

FIG. 4 shows an example of the structure of a bias circuit which is suited for the buffer amplifier of FIG. 3 and has a small process dispersion. The difference from the bias circuit of FIG. 2 resides: in that a diode-connected level-down MOSFET Q60 is connected between the MOSFETs Q57 and Q56; in that a MOSFET Q61 and a diode-connected MOSFET Q62 are connected in series between the MOSFETs Q58 and Q59; and in that the MOSFET Q61 is current-mirror connected with the aforementioned MOSFET Q60.

The bias circuit of this embodiment is also so designed that the currents to flow through the MOSFETs Q57 and Q58 are identical (to $I_{B2}$). Moreover, the constants of the individual elements are determined by making use of the threshold voltages Vth of the individual MOSFETs: such that the bias voltage $V_{B1}$ is set to a value of about 4.2 V which is lower than the supply voltage $V_{DD}$ by the voltage Vth of the MOSFET Q57; such that the bias voltage $V_{B3}$ is set to a value of about 3.4 V which is far lower by the voltage Vth of the MOSFET Q60; such that the bias voltage $V_{B2}$ is set to a value of about 0.7 V which is higher than the earth potential by the voltage Vth of the MOSFET Q59; and such that the bias voltage $V_{B4}$ is set to a value of about 1.4 V which is far higher by the voltage Vth of the MOSFET Q62.

Figure 10:
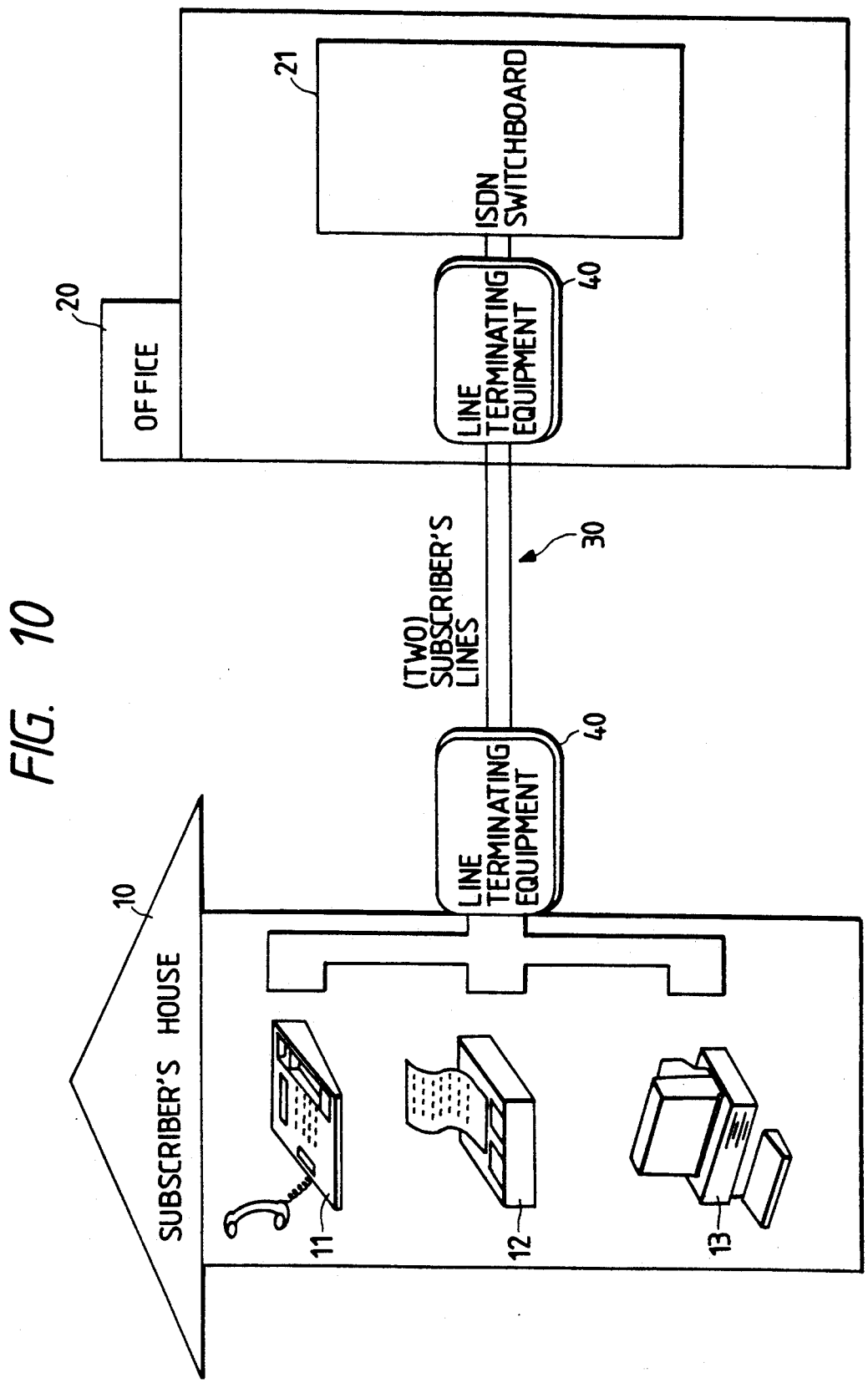
FIG. 10 is a explanatory diagram showing one example of the system construction of the ISDN communications net.

FIG. 10 schematically shows the ISDN communications net exemplifying a suitable system using the amplifier of the present invention. In recent years, the digitalization of the communications net called the ISDN communications net is being developed. In this ISDN communications net, a subscriber's house 10 and an office 20 are connected by a pair of subscriber's lines 30. An echo canceler type line terminating equipment 40 is installed in each of the subscriber's house 10 and the office 20 so that a digital transmission at a high speed such as 144 kbps can be accomplished by using the existing subscriber's lines.

Incidentally, in FIG. 10: reference numeral 11 designates a digital telephone unit; numeral 12 designates a facsimile; numeral 13 designates a data terminating unit such as a personal computer; and numeral 21 designates an ISDN switchboard.

Figure 11:
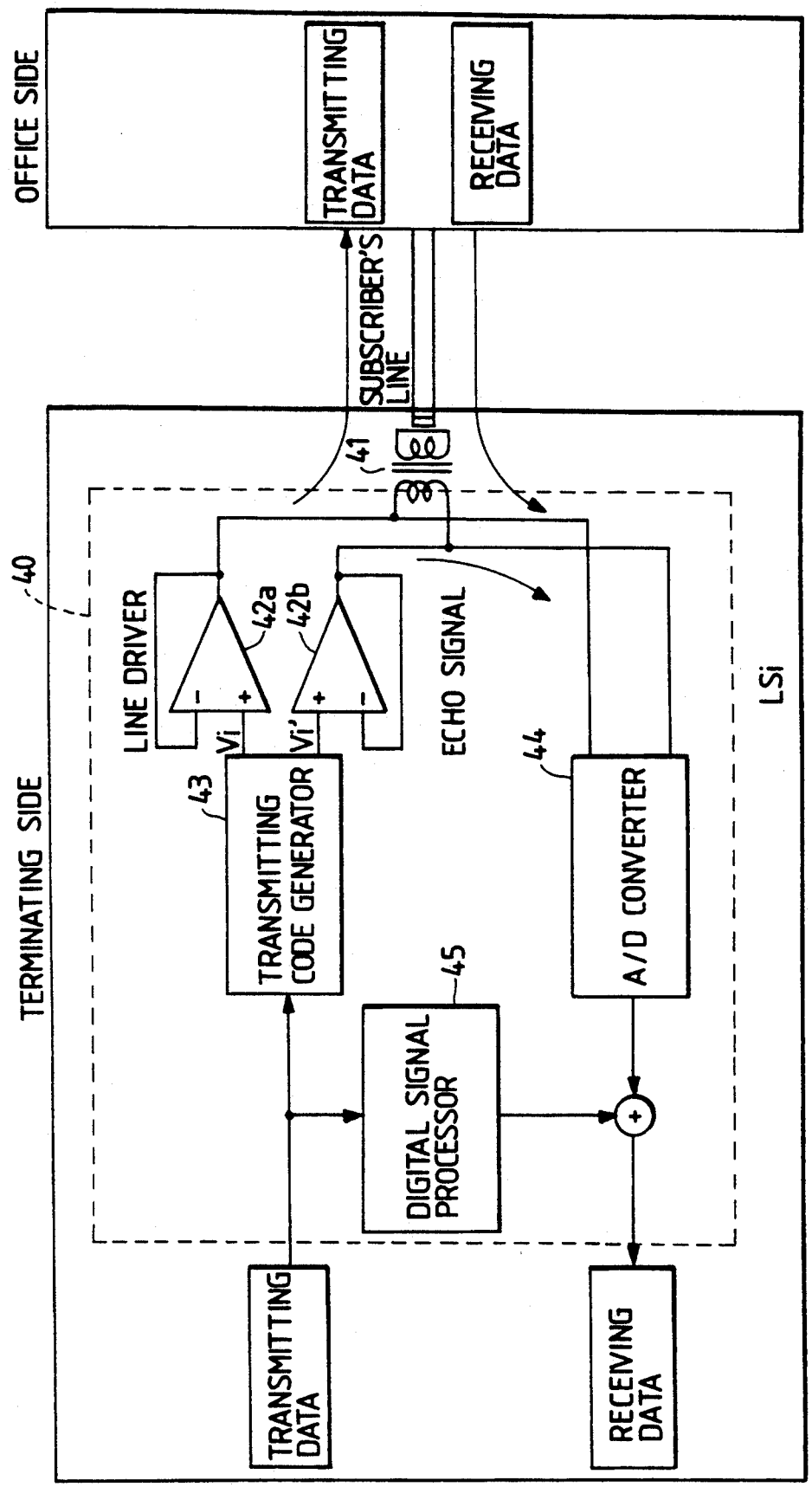
FIG. 11 is a block diagram showing one example of the line terminating equipment of the ISDN communications net.
Figure 12:
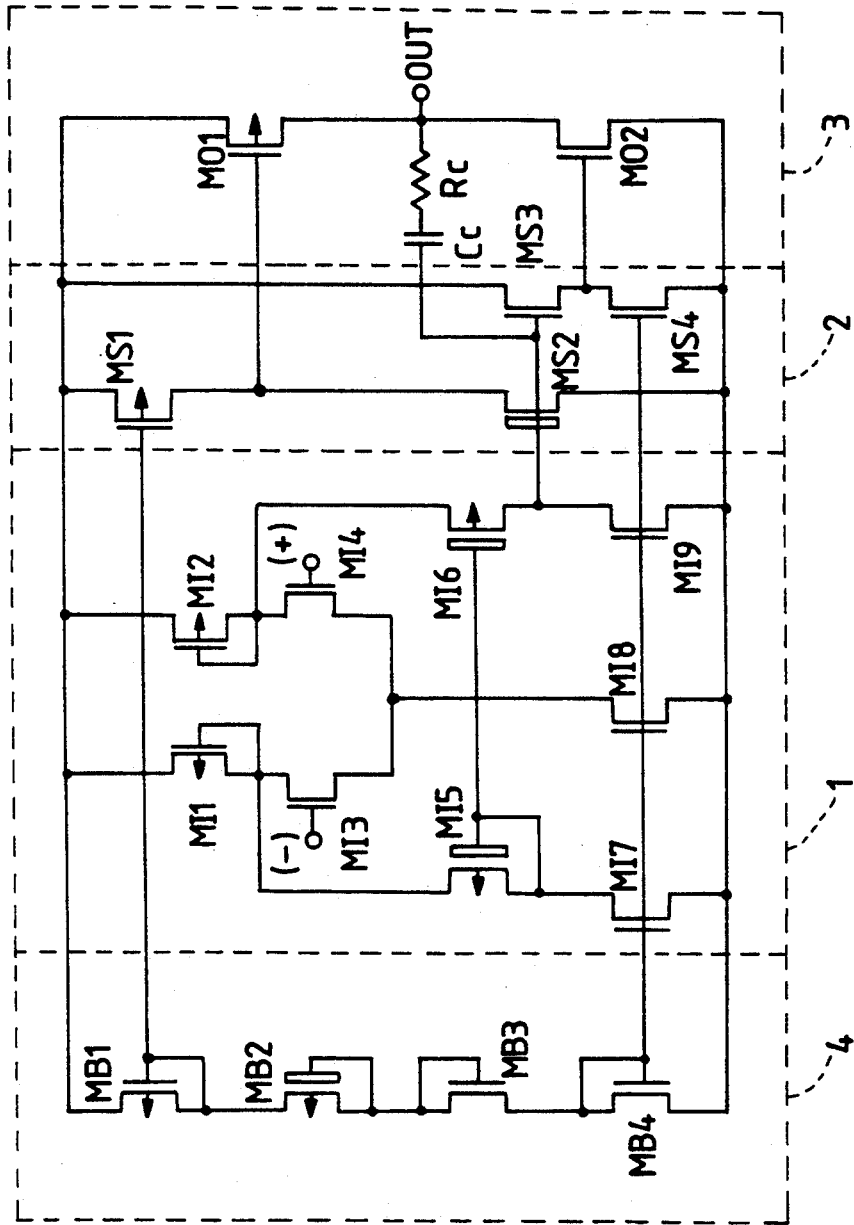
FIG. 12 is a circuit diagram showing one example of the buffer amplifier using portions of the prior art and useful in the analysis portion of the present invention.

FIG. 11 shows one embodiment of the aforementioned line terminating equipment 40.

In the same figure: reference numeral 41 designates a transformer connected with the terminal end of the subscriber's lines 30; numerals 42a and 42b designate line drivers for driving the subscriber's lines 30 through the aforementioned transformer 41; and numeral 43 designates a transmitting code generator for coding the transmitting data (e.g., digital signals) by the 2B1Q method, for example, and for D/A converting the coded signals thereby to feed them in the form of differential signals Vi and Vi' to the line drivers 42a and 42b. Moreover, numeral 44 designates an A/D converter for converting the receiving signals sent from the office 20 through the subscriber's lines 30 into digital signals, and numeral 45 designates a digital signal processor for predicting the echo signals, which are reflected to run on the receiving lines when the line drivers 42a and 42b drive the subscriber's lines 30 through the aforementioned transformer 41, to add the echo signals to the A/D converted receiving signals thereby to generate canceling signals.

The aforementioned line transmitting equipment 40 has its usable electric power limited because it is operated by the power fed from the office 20. On the other hand, the line driver is a buffer amplifier for sending out the transmitting pulse signals to the lines through the transformer and has to drive a load of low impedance in a large amplitude. Thus, the line driver is required to have a high driving ability, a high linearity and a low power consumption.

In this embodiment, the amplifier, as shown in FIG. 1 or 3, is used as the line drivers 42a and 42b to improve the transmission characteristics of the system and to reduce the power consumption. Thanks to the construction of the differential output using the two line drivers, as shown in FIG. 11, the dynamic range is doubled to improve the anti-nozzle characteristics.

Although our invention has been specifically described in connection with its embodiments, it should not be limited to them but can naturally be modified in various manners without departing from the gist thereof. In the foregoing embodiment, for example, the MOSFET Q41 is connected as a resistance element between the drain terminals of the load MOSFETs Q23 and Q24 of the pre-buffer 2a whereas the MOSFET Q42 is connected as a resistance element between the load MOSFETs Q28 and Q29 of the pre-buffer 2b so that the gains of the pre-buffers 2a and 2b may be increased, when the input potential Vi of the amplifier changes, by applying such a potential to the gate terminals of the MOSFETs Q41 and Q42 as can operate the MOSFETs Q41 and Q42 from the unsaturated range to the saturated range to make the ON resistances of the MOSFETs Q41 and Q42 variable. Despite this disclosure, however, the method of increasing the gains of the pre-buffers 2a and 2b should not be limited thereto, but the gains may be increased by changing the currents to flow through the pre-buffers 2a and 2b.

In the foregoing embodiment, moreover, the gate voltages of the variable resistors MOSFETs Q41 and Q42 in the pre-buffers 2a and 2b are fed from the bias circuit which is formed over the common chip. Despite this disclosure, however, those gate voltages may be applied from the outside of the chip.

In the description thus far made, our invention has been described in case it is applied to the backgrounding field of application, i.e., the transmitting buffer amplifier for driving the subscriber's lines. Despite this disclosure, however, the present invention should not be limited thereto but can be generally utilized in an operational amplifier for driving a load of low impedance.

The effects to be obtained by the representative of the invention disclosed herein will be briefly described in the following.

Specifically, it is possible to realize an AB grade buffer amplifier which can drive the load of low impedance stably at a low power consumption with output MOSFETs of the minimum size.

Moreover, the driving ability of the low-impedance load can be improved while suppressing the fluctuations of the output characteristics of the pre-buffers due to the input offset dispersion within a practically allowable range. While a preferred embodiment has been set forth with specific details, further embodiments, modifications and variations are contemplated according to the broader aspects of the present invention, all as determined by the spirit and scope of the following claims.

What is claimed is:

1. An operational amplifier comprising:
   a differential input stage;
   a push-pull type output stage; and
   level shifting means for level-shifting the output of said differential input stage to transmit the level-shifted output to said push-pull type output stage, wherein said level shifting means includes: a first differential amplifier having a current mirror type load including a pair of P-channel type MOSFETs; and a second differential amplifier having a current mirror type load including a pair of N-channel type MOSFETs, and wherein a resistance element is connected between the drain terminals of each of said pairs of MOSFETs.

2. An operational amplifier according to claim 1, wherein each said resistance element includes a MOSFET.

3. An operational amplifier according to claim 2, wherein the resistance element connected between the drain terminals of said pair of P-channel type MOSFETs is a P-channel type MOSFET, and wherein the resistance element connected between the drain terminals of said pair of N-channel type MOSFETs is an N-channel type MOSFET.

4. An operational amplifier according to claim 3, wherein the resistance element that is a P-channel type MOSFET has a higher resistance than the resistance element that is the N-channel type MOSFET.

5. An operational amplifier according to claim 4, wherein the resistance element that is P-channel type MOSFET has its gate terminal coupled to a first supply voltage terminal, and wherein the resistance element that is an N-channel type MOSFET has its gate terminal coupled to a second supply voltage terminal.

6. An operational amplifier according to claim 4, wherein the resistance element that is a P-channel type MOSFET and the resistance element that is an N-channel MOSFET have their gate terminals fed with an intermediate voltage between a positive supply voltage to be fed to said first supply voltage terminal and a ground voltage to be fed to said second supply voltage terminal.

7. An operational amplifier according to claim 6, wherein said P-channel type MOSFET and said N-channel type MOSFET constituting said resistance elements individually operate from an unsaturated range to a saturated range.

8. An operational amplifier according to claim 7, wherein said differential input stage is a folded cascode type differential amplifier including: a differential amplifier having an output; and amplification means having a current source for feeding a bias current, and a gate-grounded type MOSFET for receiving the bias current, for receiving the output of said differential amplifier at its source terminal, and for outputting from its drain terminal.

* * * * *